United States Patent
Baggen et al.

(10) Patent No.: US 11,302,512 B2
(45) Date of Patent: Apr. 12, 2022

(54) ELECTRON BEAM INSPECTION APPARATUS STAGE POSITIONING

(71) Applicant: ASML Netherlands B.V., Veldhoven (NL)

(72) Inventors: Marcel Koenraad Marie Baggen, Veldhoven (NL); Antonius Henricus Arends, Veldhoven (NL); Lucas Kuindersma, Veldhoven (NL); Johannes Hubertus Antonius Van De Rijdt, Veldhoven (NL); Peter Paul Hempenius, Veldhoven (NL); Robertus Jacobus Theodorus Van Kempen, Veldhoven (NL); Niels Johannes Maria Bosch, Veldhoven (NL); Henricus Martinus Johannes Van De Groes, Veldhoven (NL); Kuo-Feng Tseng, San Jose, CA (US); Hans Butler, Veldhoven (NL); Michael Johannes Christiaan Ronde, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/809,519

(22) Filed: Mar. 4, 2020

(65) Prior Publication Data
US 2020/0203118 A1 Jun. 25, 2020

Related U.S. Application Data

(63) Continuation of application No. PCT/EP2018/073548, filed on Aug. 31, 2018.
(Continued)

(30) Foreign Application Priority Data

Sep. 4, 2017 (EP) ..................................... 17189213

(51) Int. Cl.
*H01J 37/20* (2006.01)

(52) U.S. Cl.
CPC ......... *H01J 37/20* (2013.01); *H01J 2237/202* (2013.01); *H01J 2237/20214* (2013.01);
(Continued)

(58) Field of Classification Search
CPC ............. H01J 37/20; H01J 2237/20228; H01J 2237/20235; H01J 2237/20207; H01J 2237/202; H01J 2237/20214
(Continued)

(56) References Cited

U.S. PATENT DOCUMENTS

2001/0006762 A1* 7/2001 Kwan ................. G03F 7/70716
430/311
2002/0085192 A1 7/2002 Miura et al.
(Continued)

FOREIGN PATENT DOCUMENTS

CN 1479174 A 3/2004
CN 102349147 A 2/2012
(Continued)

OTHER PUBLICATIONS

International Search Report and Written Opinion issued in related International PCT Application No. PCT/EP2018/073548, dated Jan. 21, 2019 (2 pgs.).
(Continued)

*Primary Examiner* — Kiet T Nguyen
(74) *Attorney, Agent, or Firm* — Finnegan, Henderson, Farabow, Garrett & Dunner, LLP

(57) ABSTRACT

An electron beam apparatus includes an electron optics system to generate an electron beam, an object table to hold the specimen at a target position so that a target portion of the specimen is irradiated by the electron beam, and a positioning device to displace the object table relative to the
(Continued)

electron beam. The positioning device includes a stage actuator and a balance mass. The stage actuator exerts a force onto the object table to cause an acceleration of the object table. The force onto the object table results in a reaction force onto the balance mass. The balance mass moves in response to the reaction force. The positioning device enables the balance mass to move in a first direction in response to a component of the reaction force in the first direction.

19 Claims, 10 Drawing Sheets

Related U.S. Application Data

(60) Provisional application No. 62/583,290, filed on Nov. 8, 2017.

(52) U.S. Cl.
CPC .............. *H01J 2237/20228* (2013.01); *H01J 2237/20235* (2013.01)

(58) Field of Classification Search
USPC .................................................. 250/442.11
See application file for complete search history.

(56) References Cited

U.S. PATENT DOCUMENTS

| | | | |
|---|---|---|---|
| 2004/0008331 A1* | 1/2004 | Cox | G03F 7/70758 355/53 |
| 2005/0205809 A1 | 9/2005 | Uchida | |
| 2007/0076216 A1 | 4/2007 | Eckes et al. | |
| 2007/0206169 A1 | 9/2007 | Butler | |
| 2007/0279644 A1* | 12/2007 | Teun Plug | G03F 7/70766 356/625 |
| 2009/0262325 A1* | 10/2009 | Butler | G03F 7/70758 355/72 |
| 2014/0340666 A1 | 11/2014 | Butler et al. | |
| 2015/0286154 A1 | 10/2015 | Wang | |
| 2017/0047193 A1 | 2/2017 | Jiang et al. | |
| 2017/0365502 A1 | 12/2017 | Kniknie et al. | |

FOREIGN PATENT DOCUMENTS

| | | |
|---|---|---|
| CN | 105593966 A | 5/2016 |
| JP | 2004134745 A | 4/2004 |
| JP | 2005268268 A | 9/2005 |
| JP | 2006303312 A | 11/2006 |
| JP | 2007258695 A | 10/2007 |
| JP | 2010217032 A | 9/2010 |
| TW | 479156 | 3/2002 |
| TW | 200308043 A | 12/2003 |
| TW | 201730686 A | 9/2017 |
| WO | WO 2011/043391 A1 | 4/2011 |
| WO | WO 2013/188547 A1 | 12/2013 |
| WO | WO 2017/089214 A1 | 6/2017 |

OTHER PUBLICATIONS

Chinese Office Action issued in related Chinese Application No. 10820393620, dated Apr. 30, 2019 (6 pgs.).

Office Action of the Intellectual Property Office of Taiwan issued in related Taiwanese Patent Application No. 109107360, dated Jan. 28, 2021 (13 pgs.).

Notice of Reasons for Rejection issued by the Japanese Patent Office in related Application No. JP 2020-509111, dated Dec. 18, 2020 (13 pgs.).

Notification of Reason(s) for Refusal issued in related Korean Patent Application No. 10-2020-7006380; dated Oct. 23, 2021 (12 pgs.).

First Office Action issued in related Chinese Patent Application No. 2018800571979; dated Dec. 3, 2021 (14 pgs.).

\* cited by examiner

ELECTRON BEAM INSPECTION APPARATUS STAGE POSITIONING

CROSS-REFERENCE TO RELATED APPLICATIONS

This application claims priority to International Application No. PCT/EP2018/073548, filed Aug. 31, 2018, and published as WO 2019/043204 A1, which claims priority of EP application No. 17189213.6 which was filed on Sep. 4, 2017 and U.S. provisional application No. 62/583,290 which was filed on Nov. 8, 2017. The contents of these applications are each incorporated herein by reference in their entireties.

FIELD

The present description relates to a stage positioning device for an electron beam inspection apparatus configured to inspect a specimen. The present description relates to an electron-beam (e-beam) inspection tool as can be applied to inspect semiconductor devices.

BACKGROUND

In the semiconductor processes, defects are inevitably generated. Such defects may impact device performance even up to failure. Device yield may thus be impacted, resulting in cost raise. In order to control semiconductor process yield, defect monitoring is important. One tool useful in defect monitoring is SEM(Scanning Electron Microscope) which scans a target portion of a specimen using one or more beams of electrons.

Accurate positioning of the one or more beams of electrons on the target portion is required to reliably monitor defects. The positioning requirements may need to be further enhanced for monitoring even smaller defects. At the same time, a high throughput is desired which typically requires to increase a velocity of a movement of the specimen, as well as accelerations and decelerations thereof. Also, settling times during which the inspection apparatus may be allowed to settle after a movement of the specimen has stopped, may need to be decreased. All in all, the above may result in an enhancement of requirements on the accuracy and dynamics of the positioning of the specimen.

SUMMARY

It is desirable to provide, for example, an electron beam inspection apparatus that enables an accurate positioning of the specimen.

According to an aspect, there is provided an electron beam apparatus, the apparatus comprising:
  an electron optics system configured to generate an electron beam;
  an object table configured to hold the specimen at a target position so that a target portion of the specimen is irradiated by the electron beam; and
  a positioning device configured to displace the object table relative to the electron beam, the positioning device comprising a stage actuator and a balance mass, the stage actuator configured to exert a force onto the object table to cause an acceleration of the object table, the force onto the object table resulting in a reaction force onto the balance mass, the balance mass is configured to move in response to the reaction force, wherein the positioning device is configured to enable the balance mass to move in a first direction in response to a component of the reaction force in the first direction.

BRIEF DESCRIPTION OF THE DRAWINGS

Embodiments of the present disclosure will be readily understood by the following detailed description in conjunction with the accompanying drawings, wherein like reference numerals designate like structural elements, and in which.

Figure 1A:
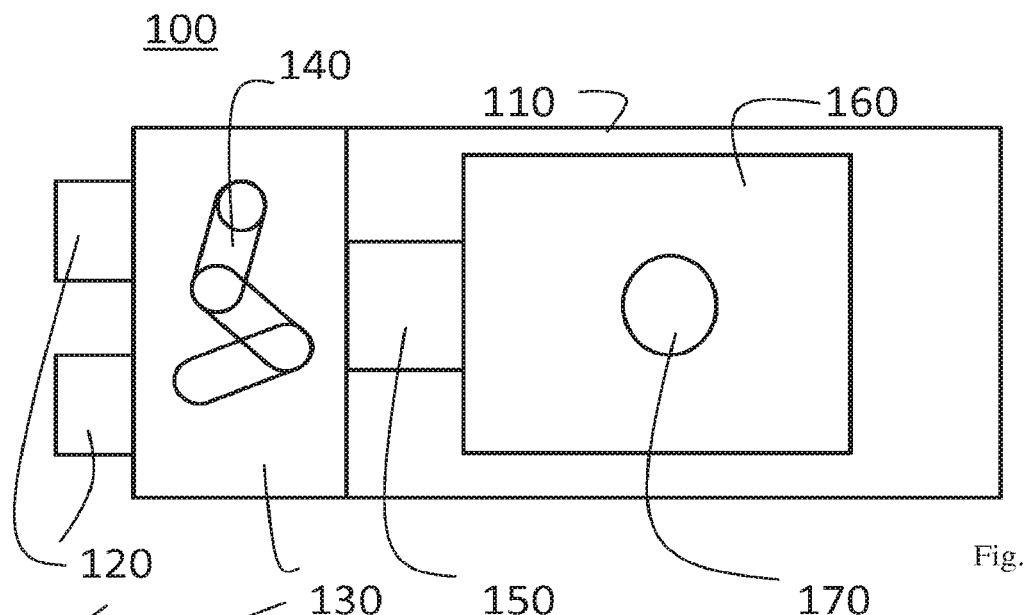
FIG. 1A and FIG. 1B are schematic illustrations of an e-beam inspection tool in which embodiments of the present disclosure may be applied.

While the implementation of the disclosed embodiment is susceptible to various modifications and alternative forms, specific embodiments thereof are shown by way of example in the drawings and may herein be described in detail. The drawings may not be to scale. It should be understood, however, that the drawings and detailed description thereto are not intended to limit the disclosed embodiment to the particular form disclosed, but on the contrary, the intention is to cover all modifications, equivalents and alternatives falling within the spirit and scope of the present disclosure as defined by the appended claims.

DETAILED DESCRIPTION

Various example embodiments of the present disclosure will now be described more fully with reference to the accompanying drawings in which some example embodiments of the present disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. This disclosure may, however, may be embodied in many alternate forms and should not be construed as limited to only the embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure. Like numbers refer to like elements throughout the description of the figures.

As used herein, the term "specimen" generally refers to a substrate or any other specimen on which defects of interest (DOI) may be located. Although the terms "specimen" and "sample" are used interchangeably herein, it is to be understood that embodiments described herein with respect to a substrate may configured and/or used for any other specimen (e.g., a reticle, mask, or photomask).

As used herein, the term "substrate" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

As used herein, "axial" means "in the optical axis direction of an apparatus, column or a device such as a lens", while "radial" means "in a direction perpendicular to the optical axis". Usually, the optical axis starts from the cathode and ends at the specimen. The optical axis typically refers to z-axis in the drawings.

The inspection tool described herein relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure.

Figure 1B:
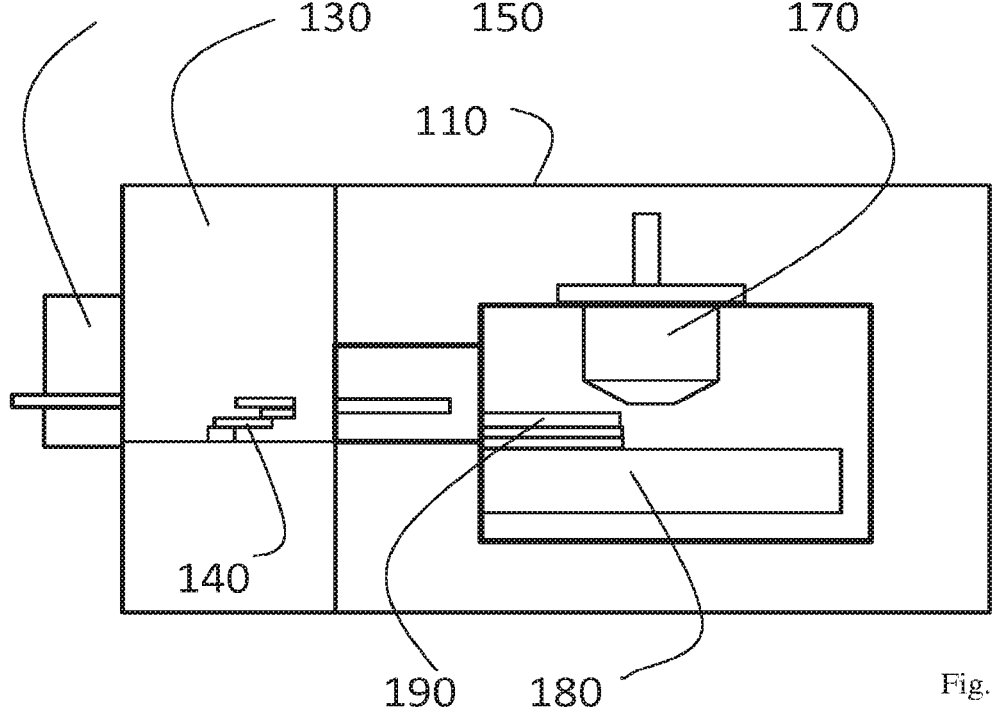

FIGS. 1A and 1B schematically and respectively depict a top view and a cross-sectional view of an e-beam inspection (EBI) system 100 as may be applied in an embodiment of the present disclosure. The embodiment as shown comprises an enclosure 110, a pair of load ports 120 serving as an interface to receive objects to be examined and to output objects that have been examined. The embodiment as shown further comprises an object transfer system, referred to as an equipment front end module (EFEM) 130, that is configured to handle and/or transport the objects to and from the load ports. In the embodiment as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the embodiment as shown, the vacuum chamber 160 comprises an electron optics system 170 configured to project an e-beam onto an object to be inspected, e.g. a semiconductor substrate. The EBI system 100 further comprises a positioning device 180 that is configured to displace the object 190 relative to the e-beam generated by the electron optics system 170.

In an embodiment, the positioning device may comprise a cascaded arrangement of multiple positioners such as an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances.

In an embodiment, the positioning device 180 further comprises an object table to hold the object during the inspection process performed by the EBI system 100. In such an embodiment, the object 190 may be clamped onto the object table by means of a clamp such as an electrostatic clamp. Such a clamp may be integrated in the object table.

Figure 2:
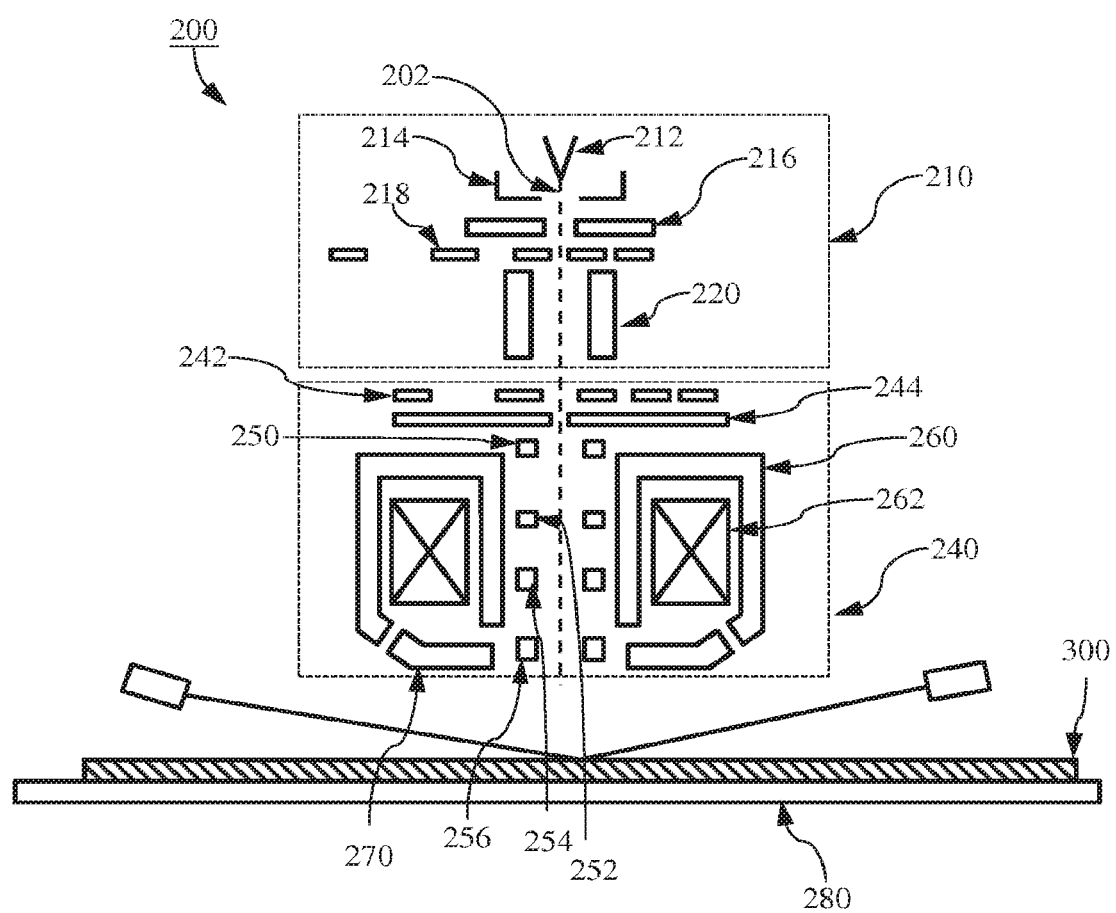
FIGS. 2 and 3 are schematic illustrations of an electron optical system as may be applied in an embodiment of the present disclosure.

FIG. 2 schematically depicts an embodiment of an electron optics system 200 as can be applied in an embodiment of an e-beam inspection tool or system according to an embodiment of the present disclosure. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, in an embodiment, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bent to form a tip for placing the tungsten pin. Next, ZrO2 is coated on the surface of the tungsten pin, and is heated to 1300° C. so as to be melted and cover the tungsten pin but uncover the pinpoint of the tungsten pin. The melted ZrO2 can lower the work function of the tungsten and decrease the energy barrier of the emitted electron, and thus the electron beam 202 can be emitted efficiently. Then, by applying a negative charge to the suppressor 214, the electron beam 202 is suppressed. Accordingly, the electron beam having a large spread angle is suppressed to the primary electron beam 202, and thus the brightness of the electron beam 202 is enhanced. By a positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in FIG. 2 may e.g. be an electrostatic lens which can condense the electron beam 202. On the other hand, the condenser 220 can be a magnetic lens.

Figure 3:
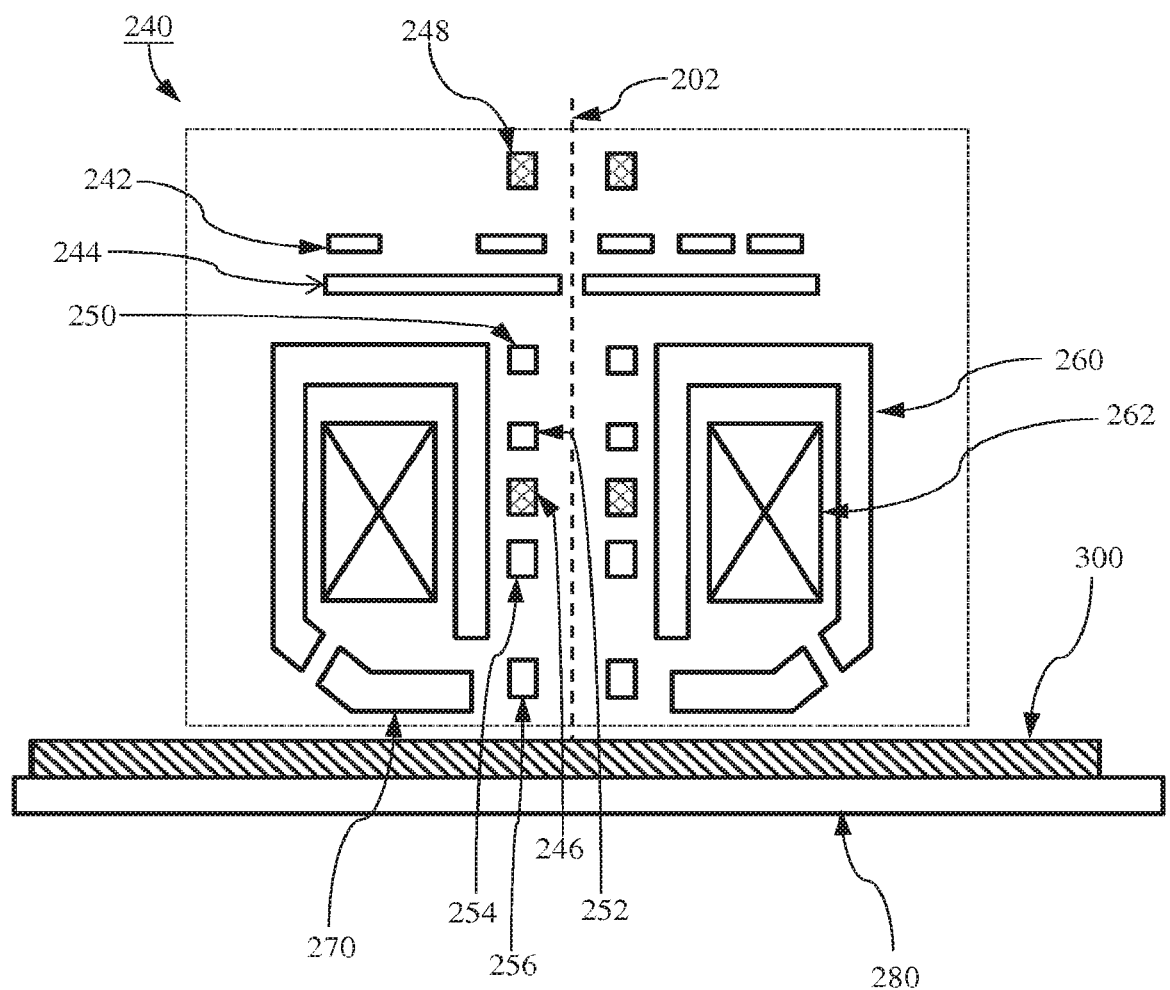

The imaging system 240 as shown in FIGS. 2 and 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has an electrostatic lens function due to the combination of upper pole piece and sample 300, which is held on support 280. The coil 262 and the yoke 260 are configured to as a magnetic objective lens.

The electron beam 202, described above, is generated by heating the electron pin and applying the electric field to anode 216, so that, in order to stabilize the electron beam 202, there should be a long time for heating the electron pin. From the end user viewpoint, this can be seen as time consuming and inconvenient. Hence, the blanker 248 is applied to the condensed electron beam 202 to temporally deflect the electron beam 202 away from the sample rather than turning it off.

The deflectors 250 and 256 are applied to scan the electron beam 202 within a large field of view, and the deflectors 252 and 254 are used for scanning the electron beam 202 within a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 faces toward the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

When the electron beam 202 bombards into the sample 300, a secondary electron will be emanated from the surface of the sample 300. The secondary electron is directed to the detector 244 by the filter 246.

Figure 4:
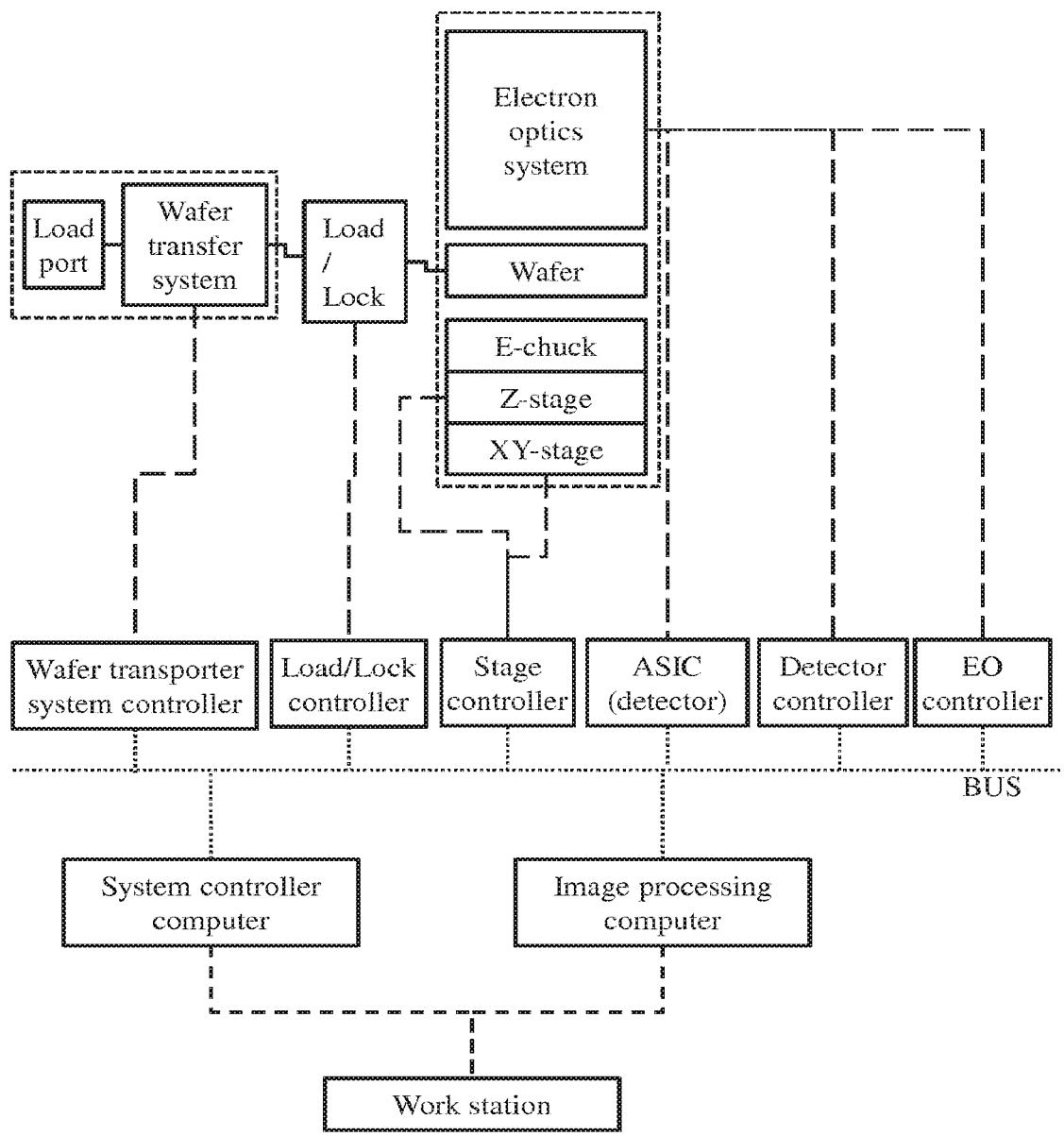
FIG. 4 schematically depicts a possible control architecture of an EBI system as may be applied in an embodiment of the present disclosure.

FIG. 4 schematically depicts a possible control architecture of an EBI system as may be applied in an embodiment of the present disclosure. As indicated in FIG. 1, the EBI system comprises a load port, a substrate transfer system, a load/lock, an electron optics system and a positioning device, e.g. including a z-stage and a x-y stage. As illustrated, these various components of the EBI system may be equipped with respective controllers, i.e., a substrate transporter system controller connected to the substrate transfer system, a load/lock controller, an electron optics controller, a detector controller, a stage controller, etc. These controllers may e.g. be communicatively connected to a system controller computer and an image processing computer, e.g. via a communication bus. In the embodiment as shown, the system controller computer and the image processing computer may be connected to a workstation.

The load port loads a substrate to the substrate transfer system, and the substrate transfer system controller controls the substrate transfer to transfer the substrate to the load/lock. The load/lock controller controls the load/lock to the chamber, such that an object that is to be examined, e.g. a substrate can be fixed on a support, e.g. an electrostatic clamp, also referred to as an e-chuck. The positioning device, e.g. the z-stage and the xy-stage, enable the substrate to move by control using the stage controller. In an embodiment, a height of the z-stage may e.g. be adjusted using a piezo component such as a piezo actuator. The electron optic controller may control all the conditions of the electron optics system, and the detector controller may receive and convert the electric signals from the electron optic system to image signals. The system controller computer is used to send the commands to the corresponding controller. After receiving the image signals, the image processing computer may process the image signals to identify defects.

In the above described examples, the object table is moved by the positioning device, which is in turn mounted to a frame, being the vacuum vessel. As a result, acceleration and deceleration of the object table results in a reaction force which is transferred to the frame, thus to the vacuum vessel. The reaction force may hence result in a vibration and/or deformation of the vacuum vessel which may translate into a positioning inaccuracy of the positioning of the specimen. As the electron optics system which generates the electron beam, is also mounted to the vacuum vessel, the deformations may further cause inaccuracy of the positioning of the electron beam.

An object table to gas mount feed-forward may be provided in order to at least partly compensate an effect of reaction forces. Such a compensation may reduce an effect of the reaction force; however it may be effective in a limited frequency range only, due to bandwidth constraints of the feed-forward.

As future requirements on a throughput of the system tend to increase, resulting higher stage accelerations may result in even higher reaction forces, thereby aggravating the above drawback.

Figure 5A:
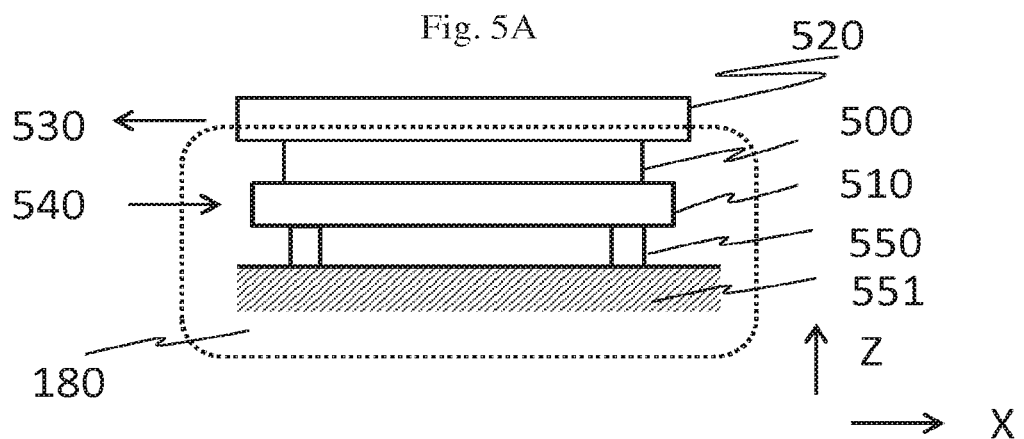
FIG. 5A, FIG. 5B, FIG. 5C and FIG. 5D each depict a schematic view of a part of an electron beam inspection apparatus in accordance with an embodiment of the present disclosure.

According to an embodiment of the present disclosure, the positioning device 180 comprises a stage actuator 500 and a balance mass 510 as schematically depicted in FIG. 5A. The stage actuator is configured to exert a force 530 onto the object table 520, thereby causing an acceleration of the object table 520. The force 530 onto the object table 520 results in a reaction force 540 onto the balance mass 510. The balance mass 510 moves in response to the reaction force. Thereby, the balance mass 510 at least partly accommodates the reaction force, resulting in a movement of the balance mass 510. For example, the stage actuator 500 may be arranged between the object table 520 and the balance mass 510. A force generated by the stage actuator 500, acting on the object table 520, will hence result in the reaction force on the balance mass 510. The reaction force may result in a corresponding movement of the balance mass 510, for example in a direction opposite to the force exerted by the stage actuator 500 onto the object table 520. Thus, a reaction force onto other structures of the electron beam inspection apparatus, such as on the vacuum vessel, may be reduced.

The balance mass 510 may for example have a weight which exceeds a weight of the object table 520. For example, the balance mass 510 may e.g. be 5 times or 10 times heavier than the object table 520. As a weight of the balance mass 510 exceeds a weight of the object table 520, a stroke of movement of the balance mass 510 may be smaller than the stroke of the object table 520.

In order to further reduce a stroke of the balance mass 510, the balance mass 510 may be provided with damping 550. The damping 550 is supported on a base plate 551. The damping 550 may comprises a passive damping. The passive damping may be provided by a spring and/or a damper, such as a fluidic damper. Alternatively, or in addition thereto, the damping 550 may comprises an active damping. The active damping may for example comprise an actuator which dampens a movement of the balance mass 510. The stage actuator 500 may for example be driven in response to a sensor which senses acceleration and/or movement of the balance mass 510. Alternatively, the actuator may be driven by calculating a desired damping force from the stage actuator drive signal. As the stage actuator drive signal is known (e.g. derived from the object table set-point), a reaction force onto the balance mass 510 may be calculated therefrom. Knowing properties of the balance mass 510 (e.g. its weight, range of movement, etc.), a damping force and corresponding damping actuator drive signal may be determined, and the damping actuator may be driven accordingly.

The damping 550 may comprises a non-linear element such as a progressive spring. In one example of such non-linear element, the stiffness of the progressive spring increases (the spring force becomes larger) as the balance mass stroke becomes larger (the displacement of the balance mass becomes larger) as depicted in FIG. 5D. Alternatively, or in addition thereto, the damping 550 may comprises a non-linear element such as a gain scheduled controller. In one example of such non-linear element, the controller stiffness of the gain scheduled controller increases as the balance mass stroke becomes larger. These non-linear elements may further assist in reduction of the balance mass stroke compared to the damping 550 without the non-linear elements.

In an embodiment, the damping 550 comprises a passive damper, such as a spring and/or a damper, and an active damper comprising an actuator. A force caused by the spring and/or the damper due to the displacement of the balance mass 510 is transmitted to the stage plate 551 through the spring and/or the damper. The actuator of the active damper may also compensate for the force caused by the spring and/or the damper using feedforward control of the balance mass using the actuator, and the resulting force on the stage plate 551 may be reduced. The feedforward control signal to the actuator to compensate for the force caused by the spring and/or the damper may be derived from the set-point of the balance mass 510 that is derived from the set-point of the object table 520.

In an embodiment, the damping 550 comprises an electromagnetic actuator. The behavior of the electromagnetic actuator may be represented using a motor constant. Although often a single motor constant is used for a complete operating range of the electromagnetic actuator, in reality the motor constant is position dependent. The control accuracy of such an electromagnetic actuator may suffer from the position dependency of the motor constant, resulting in inaccurate compensation of, for example, the force caused by the spring and/or the damper. This contributes to an increased transmitted force to the base plate. The motor constant of the electromagnetic actuator is position dependent because:

the magnetic strength in the yoke varies with the position; and the coils shift in/out the magnet yoke due to the parasitic motion of the balance mass.

This position dependent motor constant may be e.g. calibrated at least partially based on the object table set-point, measured object table position, the balance mass set-point, and/or measured balance mass position. In addition, the position dependence of the motor constant may result in a control error of the electromagnetic actuator which may also at least partially be compensated using the object table set-point, measured object table position, balance mass set-point and/or measured balance mass position.

The balance mass 510 may be configured to move in a single direction or multiple directions.

Figure 5B:
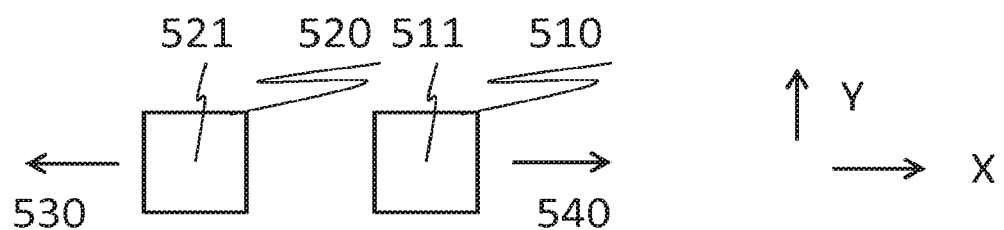

In an embodiment, as schematically depicted in FIG. 5B, the balance mass 510 may be configured to move in a single direction X, the balance mass 510 may for example be configured to move in a direction parallel to a main plane of the specimen (Since FIG. 5B depicts a top view, the main plane of the specimen in this case is the plane of drawing in FIG. 5B). The main plane (e.g. top surface) of the specimen may coincide with a main plane of movement of the object table 520 (likewise being the plane of drawing in FIG. 5B). This plane may be defined by first and second directions X, Y (as indicated in FIG. 5B), which may be orthogonal. The single direction of movement of the balance mass 510 may coincide with a main direction of movement of the object table 520. For example, the single direction may coincide with a scanning direction. As the object table 520 accelerates along the first direction, the balance mass 510 may accelerate in an opposite direction along the first direction. Thus, the balance mass 510 may accommodate a component of the reaction force along the first direction hence being able to at least partly compensate for reaction forces in the first direction. In an embodiment, a center of gravity 521 of the object table 520 and a center of gravity 511 of the balance mass 510 are coplanar in the plane defined by the first and second directions. Thereby, disturbance torques may be reduced. The disturbance torques result from a force by the positioning device on the object table causing an acceleration of the object table and an associated reaction by the further balance mass. The balance mass may be movable in one direction in the horizontal plane, e.g. the X direction or the Y direction. Hence, in such an embodiment, the balance mass is able to absorb reaction forces in that direction. The positioning device may comprise an actuator such as a linear motor comprising a movable part and a stationary part. The movable part may be connected to the object table. The stationary part may be connected to the balance mass. Thus, the stationary part may, in response to the reaction force, move with the balance mass. The balance mass may be formed by a single object or dual balance mass parts, such as one at each side of the object table as seen along the direction of movement of the balance mass. Hence, using dual balance mass parts, resulting disturbance torques may be reduced and a balance mass having a high weight may be applied.

Figure 5C:
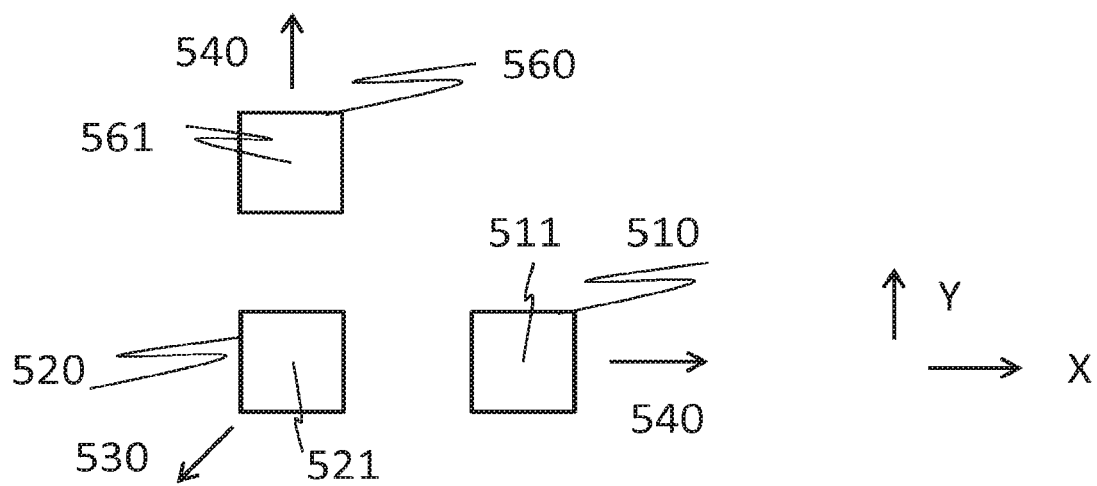
Figure 5D:
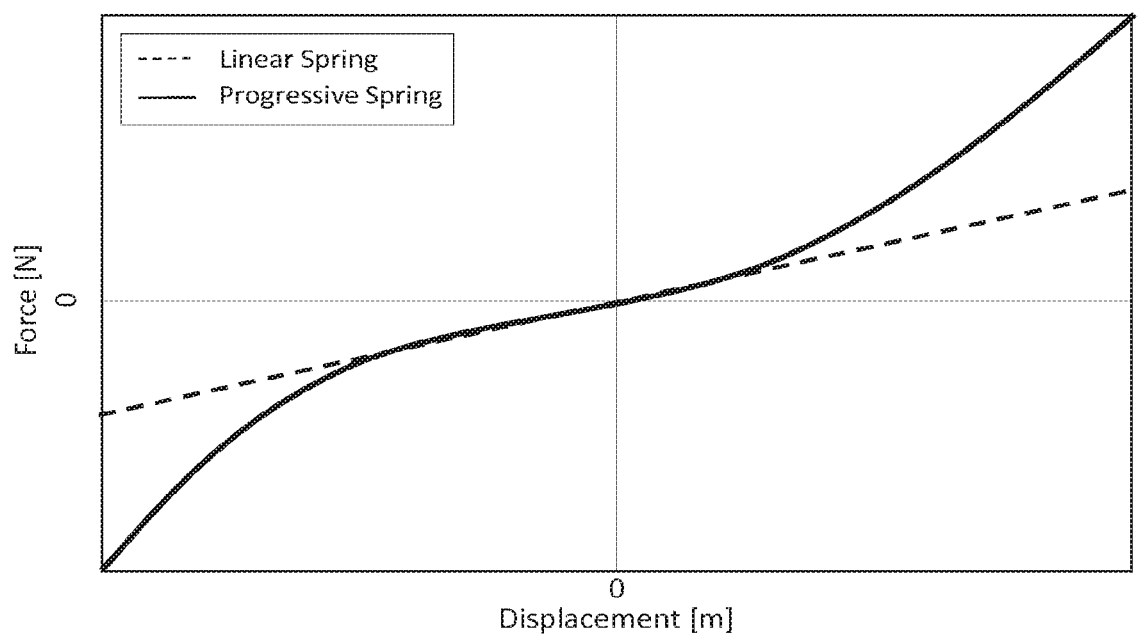

In the case of the balance mass that is movable in one dimension, as schematically depicted in FIG. 5C, a further balance mass 560 may be provided, which further balance mass 560 is movable along the second direction Y. The further balance mass 560 is movable is response to a (component of the) reaction force in the second direction 561. Hence, using the balance mass 510 and the further balance mass 560, reaction forces in the plane defined by the first and second directions, may be accommodated. Similarly to the balance mass 510 that is movable along the first direction X, the further balance mass 560 may be arranged coplanar with the object table 520 and the balance mass 510, in the plane defined by the first and second directions X,Y. The centers of gravity 511, 521 and 561 may be arranged to be coplanar in the plane defined by the first and second directions. Thereby, disturbance torques resulting from a combined movement of the object table 520 and the balance masses 510, 520 and 560, may be avoided. As the object table 520 moves (e.g., accelerates) in the plane defined by the first and second directions, a component of the reaction force in the first direction is accommodated by the balance mass and a component of the reaction force in the second direction is accommodated by the further balance mass 560. Each of the balance masses may be movable in one direction in the horizontal plane, e.g. the X direction or the Y direction. Hence, in such an embodiment, each balance mass is able to absorb reaction forces in the respective direction. The positioning device may comprise a respective actuator for each direction. The actuators may be stacked. The actuators may for example each comprise a linear motor, each linear motor comprising a movable part and a stationary part. The movable part of a first one of the actuators may be connected to the object table. The stationary part of the first one of the actuators may be connected to the first balance mass. The movable part of the second one of the actuators may be connected to the stationary part of the first one of the actuators. The stationary part of the second one of the actuators may be connected to the second balance mass. Thus, the stationary part of the first actuator may, in response to the reaction force, move with the first balance mass. The stationary part of the second actuator may, in response to the reaction force, move with the second balance mass. As in the one dimensional case, each balance mass may be formed by a single object or dual balance mass parts, such as one at each side of the object table as seen along the direction of movement of the balance mass. Hence, using dual balance mass parts for each balance mass, resulting disturbance torques may be reduced and a balance mass having a high weight may be applied.

The further balance mass 560 may for example be positioned coplanar with the object table 520 in the plane defined by the first and second directions. In an embodiment, a center of gravity of the object table 520 and a center of gravity of the further balance mass 560 are coplanar in the plane defined by the first and second directions. Thereby, disturbance torques may be reduced. The disturbance torques resulting from a force by the positioning device on the object table 520 causing an acceleration of the object table 520 and an associated reaction by the further balance mass 560.

In another embodiment, as has been depicted in FIG. 5A, the balance mass 510 may be configured to move in the first and the second directions X,Y. Likewise, the balance mass 510 may be configured to rotate in the plane defined by the first and second directions, thus to rotate about a third direction orthogonal to the first and second directions. Hence, the balance mass 510 may accommodate reaction forces in the plane defined by the first and second directions as well as accommodate a reaction torque about the axis perpendicular to the plane, i.e. about the third direction Z. Thus, reaction force and torque as a result of a force and/or torque on the object table 520 which force and/or torque extends along the plane, may at least partly be accommodated by the balance mass 510. As the object table generally moves along the plane defined by the first and second directions, reaction forces as a result of such movements may be at least partly accommodated. Thereby, a resulting reaction force on other structures of the inspection apparatus, such as the vacuum vessel or a frame, may be reduced. The two dimensional balance mass may comprise a plate or a rectangular frame being configured to absorb reaction forces in X, Y and rZ.

Figure 6A:
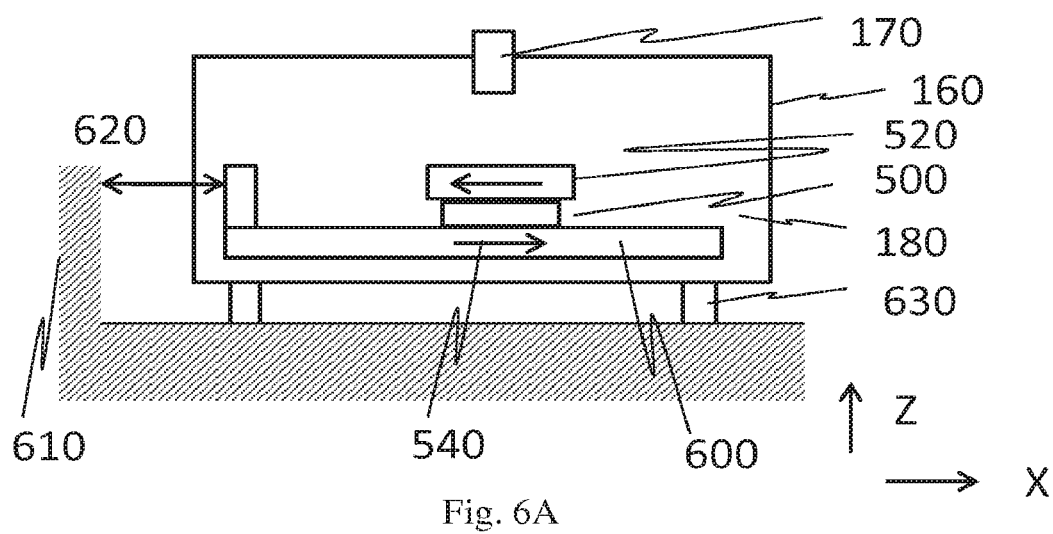
FIG. 6A, FIG. 6B and FIG. 6C each depict a schematic view of a part of an electron beam inspection apparatus in accordance with an embodiment of the present disclosure.

According to an embodiment, a motion compensation system is provided, as will be explained below with reference to FIG. 6A. As schematically shown in FIG. 6A, the positioning device 180 comprises a stage plate 600 and a stage actuator 500 configured to exert a force between the object table 520 and the stage plate 600. The force causes an acceleration of the object table and results in a reaction force 540 onto the stage plate. According to this embodiment, a motion compensation system 620 is provided. The motion compensation system acts between the stage plate 600 and a stationary structure 610 outside the vacuum vessel 160. The stationary structure may be any structure outside the vacuum vessel, such as a frame. The motion compensation system at least partly counteracts the reaction force exerted on the stage plate. The stage plate is mounted to the vacuum vessel by means of a vibration isolation 630 (such as a gas mount). Hence, the vacuum vessel may be at least partly isolated from the object table and positioner. A propagation of vibrations, e.g. due to reaction forces when accelerating the object table, may at least partly be prevented. The vibrations may thereby be prevented at least in part to reach the vacuum vessel and the electron optics system 170. As a result, a reaction force onto structures of the electron beam inspection apparatus, such as on the vacuum vessel, may be reduced.

The motion compensation system may be active or passive. Exemplary embodiments are provided below.

Figure 6B:
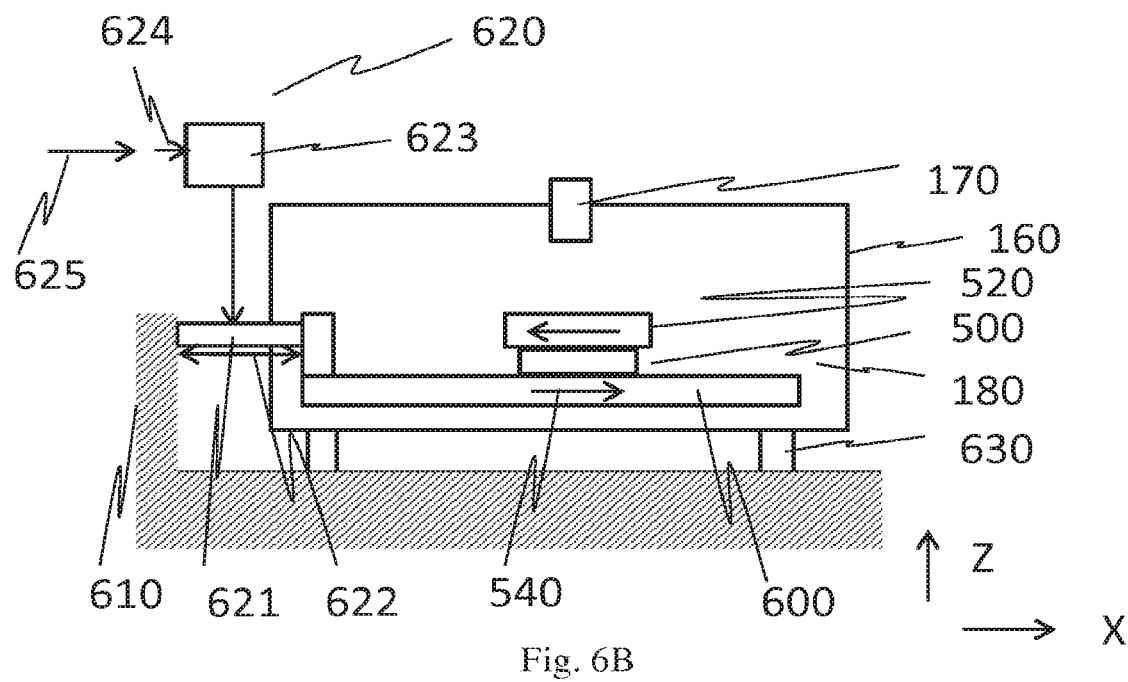

FIG. 6B depicts an embodiment of an active motion compensation system 620. The motion compensation system comprises a motion compensation actuator 621 which is arranged between the stage plate 600 and the stationary structure 610 in order to exert a force 622 between the stage plate and the stationary structure. The motion compensation system further comprises a motion compensation controller 623. A motion compensation controller output of the motion compensation controller is connected to the motion compensation actuator in order to drive the motion compensation actuator by the motion compensation controller 623. A motion compensation controller input 624 of the motion compensation controller 623 is provided with an object table position signal 625 that identifies a position of the object table. The object table position signal may be an object table position set-point signal or a measured position of the object table. The motion compensation controller 623 derives an acceleration profile from the object table position signal. Based on the acceleration profile, the motion compensation controller derives a feed-forward signal and provides the feed-forward signal to the motion compensation actuator. Hence, a feed-forward type of correction may be implemented. The feed-forward signal may represent an expected reaction force onto the stage plate, the expected reaction force being as a result of an application of a force by the positioning device onto the object table. The force by the positioning device onto the object table 520 is derived from the acceleration of the object table 520. Hence, a reaction force onto the stage plate 600 may at least partly be compensated by driving of the motion compensation actuator to exert a compensating force onto the stage plate.

FIG. 6B further depicts the vibration isolation 630, such as a vibration damper, arranged between the stage plate 600 and a wall of the vacuum vessel 160. The vibration damper may comprise a resilient material and/or may comprise a gas damper such as an air damper. The vibration damper mounts the stage plate to the vacuum vessel. Such a vibration damper may tend to exhibit a damping character for frequencies above a low frequency roll-off. The motion compensation controller may accordingly drive the motion compensation actuator in a frequency band below the low frequency roll off. Thus, the vibration damper and the motion compensation system may complement each other.

The motion compensation controller 623 may be configured to generate the feed-forward signal as a mass feed-forward in a center of gravity 521 of moving parts of the object table 520 and the actuator. As the center of gravity of moving parts of the object table 520 is taken as a reference, a torque resulting from a difference between the reaction force and the force generated by the motion compensation actuator, may be reduced.

The motion compensation actuator may comprise any suitable actuator, such as a linear motor, a piezo actuator, etc.

Figure 6C:
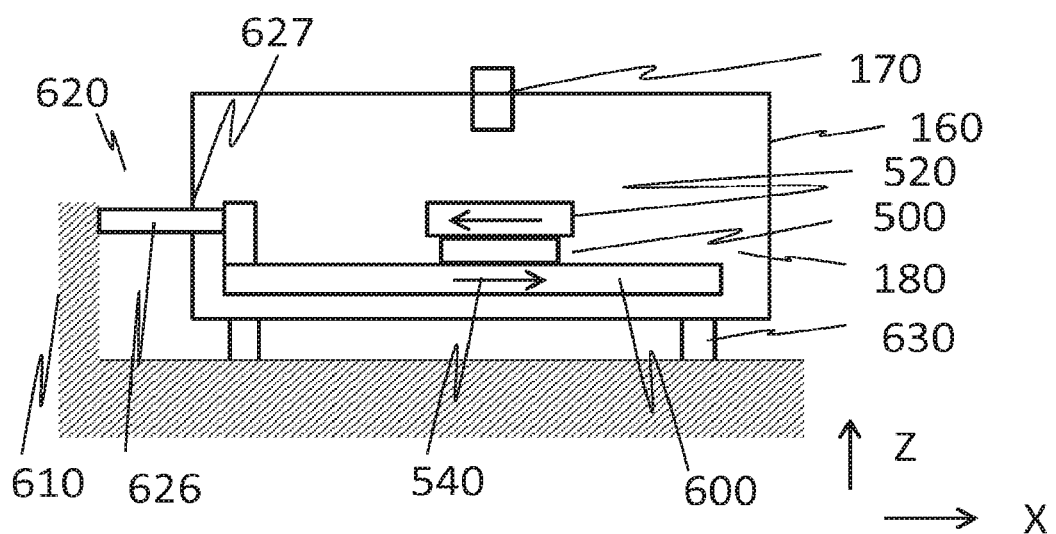

FIG. 6C depicts an embodiment of a passive motion compensation system 620. The passive motion compensation system comprises a mounting device 626 which connects the stage plate 600 to the stationary structure 610. The mounting device may be a mounting arm, a mounting rod, or any suitable mounting construction. The mounting device may be rigid, thus to provide a substantially stiff connection between the stage plate and the stationary structure. Hence, when the positioning device exerts a force onto the object table, a reaction force onto the stage plate is guided to the mounting device. As the mounting device is connected to a stationary structure outside the vacuum vessel, the reaction force is guided to the stationary structure outside the vacuum vessel. The stationary structure may be a stiff, rigid construction. Hence, a reaction force onto the stage plate is guided away from the vacuum vessel and the electron beam gun connected to it, thus to prevent at least partly the propagation of the reaction force into the vacuum vessel.

In order to decouple the mounting device from the vacuum vessel, while at the same time keeping a vacuum tight connection, a diaphragm or bellows (as schematically indicated by 627) may be provided. The mounting device connects the stage plate to the stationary structure via (guided through) the diaphragm or bellows.

The stationary structure 610 may comprise any structure outside the vacuum vessel, such as a frame. For example, the stationary structure may comprise a support of the vacuum vessel, i.e. a supporting structure that holds the vacuum vessel. Accordingly, the mounting device supports the stage plate on the support of the vacuum vessel, thus to guide the reaction force to the support of the vacuum vessel.

Figure 7A:
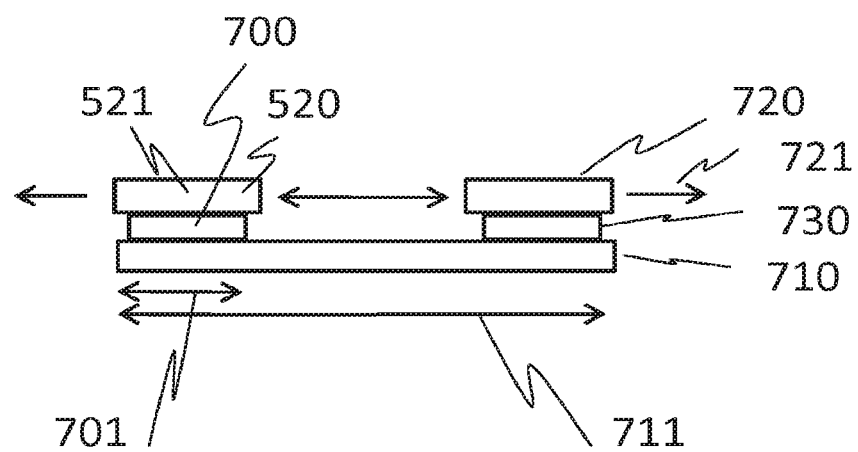
FIG. 7A depicts a schematic view of a part of an electron beam inspection apparatus in accordance with an embodiment of the present disclosure.

According to an embodiment, a reaction mass is provided, as will be explained below with reference to FIG. 7A. The positioning device 180 comprises a first actuator 700 and a second actuator 710. The first actuator 700 is configured to move the object table 500 over a first range of movement 701. The second actuator 710 is configured to move the object table and the first actuator over a second range of movement 711. The first actuator and the second actuator may, but not necessarily need to move the object table 520 in a same direction. A reaction mass 720 is provided. The first actuator 700 exerts its force, i.e. the first actuator force, between the object table 520 and the reaction mass 720. Thus, the first actuator force results in a first actuator reaction force 721 onto the reaction mass 720. The reaction mass 720 is movable in response to the reaction force. In use of the electron beam inspection tool, target portions of the surface of the specimen are to be inspected. For example, when using an electron beam inspection tool generating multiple electron beams that together cover a target portion of the surface of the specimen, the object table 520 is to be successively positioned so as to inspect neighboring parts of the surface of the specimen. Thus, a movement cycle of successive acceleration, deceleration, stopping is to be provided by the positioning device. The target portion of the specimen may for example be inspected when the specimen is in a stationary position or during a movement, e.g. a movement at a constant velocity so as to scan a target portion of the substrate. The combination of a first and a second actuator may be applied to generate various movement profiles, whereby for example one of the actuators provides for the relatively slow movements, i.e. the low frequency movement components, and the other actuator provides for the relatively quick movements, i.e. the high frequency movement components. With the reaction mass described here, specific reaction forces, as specifically occurring in response to the actuation of the first actuator, may be accommodated.

For example, the first actuator may be a short stroke actuator while the second actuator may be a long stroke actuator. Accordingly, the second range of the movement of the second actuator is larger than the first range of movement of the first actuator. The first actuator may for example be applied to perform fast, accurate movements over a relatively short range of movement. The second actuator may for example be applied to perform relatively slower movements over a larger range of movement. The actuations by the first and second actuator may provide a combined movement of the object table, whereby each of the first and second actuators takes account of a part thereof. Given that the first actuator in this configuration generally provides for high accelerations, the actuation by the first actuator will generally result in a relatively high force on the object table. Correspondingly, the actuation by the first actuator will result in a relatively high reaction force. Accordingly, this reaction force is exerted onto the reaction mass, thus to prevent, or at least reduce, an injection of the reaction force into the second actuator, the vacuum vessel and other structures of the electron beam inspection apparatus.

Figure 7B:
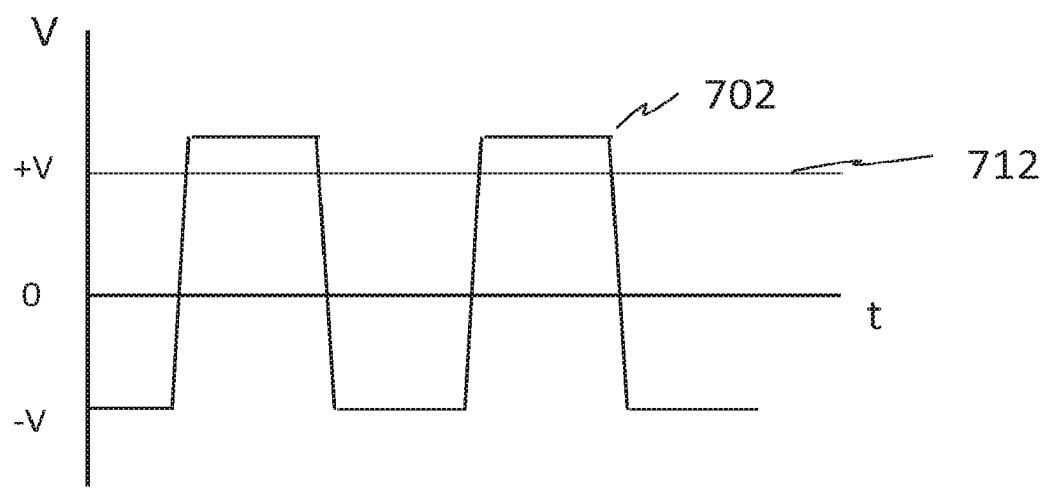
FIG. 7B highly schematically depicts a time diagram of an embodiment of a motion profile of the electron beam inspection apparatus in accordance with an embodiment of the present disclosure.

An example of the short stroke actuator and long stroke actuator may be as follows: FIG. 7B depicts a graphical view of velocity V versus time T. The second actuator, i.e. the long stroke actuator, is driven to perform a movement at a substantially constant velocity 712. The first actuator performs a movement cycle represented by velocity cycle 702. The movement cycle comprises compensating for the movement by the second actuator, thus effectively holding the object table at a stationary position, accelerating the object table to move to a next position, decelerating the object table, followed by compensating the movement of the second actuator, whereby the object table is held at a next, stationary position. Thus, in a part of the movement cycle where the object table is held stationary, the first and second positioners provide for equal, however opposite, velocities.

In this example, the reaction forces as a result of the repeated cycle of acceleration, deceleration, etc., originate for a substantial part, if not for the most part, from the first actuator, i.e. the short stroke actuator. As such, these reaction forces are accommodated by a reaction mass which directly interacts with the first actuator, so that resulting disturbance torques can be kept at a minimum.

The reaction mass may be implemented as follows. In an embodiment, the first actuator 700 comprises a movable part and a counterpart. For example, in the case of a linear motor, one of the movable part and the counterpart comprises a coil assembly and the other one of the movable part and the counterpart comprising a magnet assembly. The first actuator generates a first actuator force between the movable part and the counterpart. The movable part is connected to the object table. The reaction mass is comprised in the counterpart and being movable along the at least one direction of movement.

In an embodiment, a center of gravity 521 of the object table combined with the movable part of the first actuator 700 is co-planar with a center of gravity of the counterpart comprising the reaction mass 720. The centers of gravity may be co-planar in a plane defined by the main surface of the specimen, i.e. the main surface along which the first and second actuators perform the movement of the object table. Thereby, resulting disturbance torques may be reduced.

In order to reduce a movement of the reaction mass in response to the reaction force, a damper 730 (such as a spring) may be provided to damp the reaction movement of the reaction mass. The damper may e.g. be arranged between the reaction mass 720 and the second positioner 710.

Figure 8:
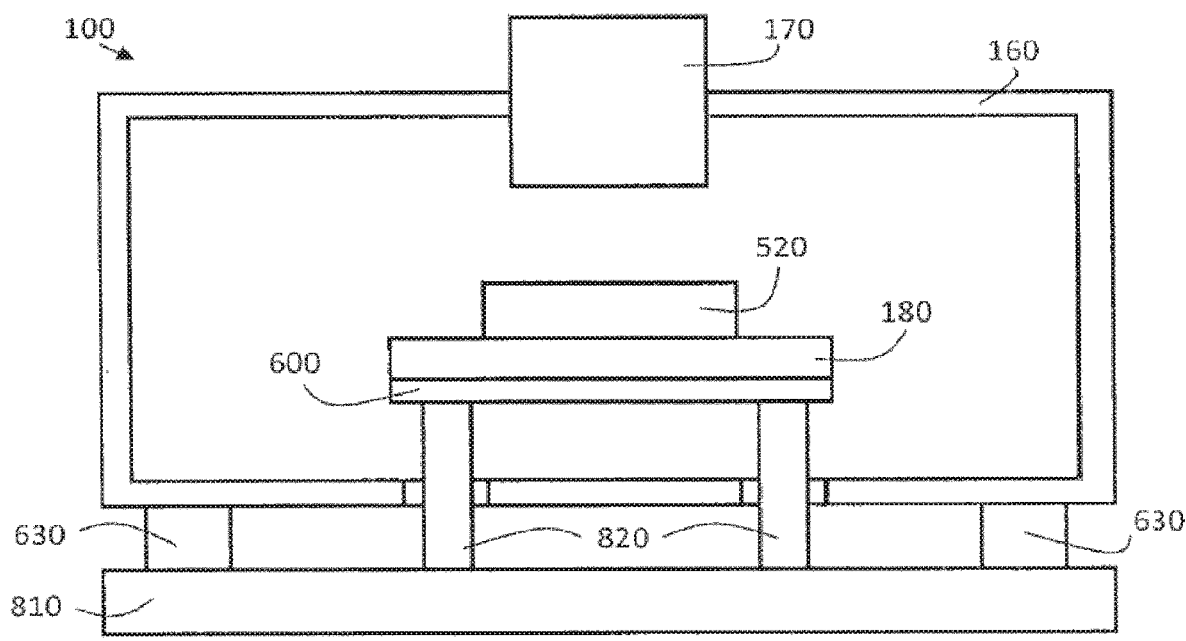
FIG. 8 depicts a further embodiment of the present disclosure.

FIG. 8 depicts a further embodiment of the present disclosure, which may be used in combination with the embodiments described above. FIG. 8 depicts the EBI system 100 comprising the electron optics system 170, the object table 520, the positioning device 180, the vacuum vessel 160 and a base frame 810. The electron optics system 170 is configured to generate a plurality of electron beams simultaneously. The object table 520 is configured to hold the specimen, e.g., a substrate, at a target position so that a target portion of the specimen is radiated with the plurality of electron beams. The positioning device 180 is configured to displace the object table 520 relative to the electron optics system 170. The vacuum vessel 160 is configured to confine a vacuum. The object table 520 and the positioning device 180 are arranged in the vacuum vessel 160. The base frame 810 is arranged to support the vacuum vessel 160 and the positioning device 180 parallel to each other.

The EBI system 100 may comprise a support element 820. The base frame 810 supports the positioning device 180 via the support element 820. The position device 180 may comprise the stage plate 600. The positioning device is configured to exert a force between the object table 520 and the stage plate 600 to cause an acceleration of the object table 520. The support element 820 supports the stage plate 600.

The support element 820 may be a single part or may comprise multiple parts. For example, the support element 820 may comprise two or four support beams or any other suitable number of support beams. The support element 820 may extend from the base frame 810 through a wall of vacuum vessel into the vacuum environment to support the positioning device 180. The wall may be provided with a hole through which the support element 820 may extend. The hole may be covered with a flexible element such as a diaphragm or bellows to prevent ambient gas to enter the vacuum environment. The flexible element may help to reduce or prevent vibrations to propagate from the support element 820 to the vacuum vessel 160.

The EBI system 100 may comprise the vibration isolation system 630. The base frame 810 supports the vacuum vessel 160 via the vibration isolation system 630. This way, propagation of a vibration from the positioning device 180, via the support element 820 and the base frame 810, to the vacuum vessel 160 is reduced. This reduces disturbances on the electron optics system 170.

In the embodiment of FIG. 8, the base frame 810 is arranged to support the vacuum vessel 160 and the positioning device 180 parallel to each other. The opposite would be to have the base frame 810 support the vacuum vessel 160, and to have the vacuum vessel 160 support the positioning device 180. This would cause the positioning device 180 to vibrate the vacuum vessel 160. By having the base frame 810 supporting the vacuum vessel 160 and the positioning device 180 parallel to each other, a vibration caused by the positioning device 180 may be absorbed by the base frame 810 before the vibration reaches the vacuum vessel 160. The base frame 810 may be a stationary frame, may have a large mass, and/or may be rigidly connected to the floor. In an embodiment, the support element 820 has a larger stiffness than the vibration isolation system 630.

Further embodiments may be described in the following clauses:
1. An electron beam apparatus, the apparatus comprising:
   an electron optics system configured to generate an electron beam;
   an object table configured to hold the specimen at a target position so that a target portion of the specimen is irradiated by the electron beam; and
   a positioning device configured to displace the object table relative to the electron beam, the positioning device comprising a stage actuator and a balance mass, the stage actuator configured to exert a force onto the object table to cause an acceleration of the object table, the force onto the object table resulting in a reaction force onto the balance mass, the balance mass is configured to move in response to the reaction force;
   wherein the positioning device is configured to enable the balance mass to move in a first direction in response to a component of the reaction force in the first direction.
2. The electron beam apparatus according to clause 1, further comprising a vacuum vessel configured to confine a vacuum of the electron beam apparatus, the object table and the positioning device arranged in the vacuum vessel.
3. The electron beam apparatus according to clause 1 or 2, wherein the first direction and a second direction define a main plane of the specimen, a third direction is orthogonal to the first and second directions, and the positioning device is configured to enable the balance mass to move in the first and second directions and to rotate about the third direction.
4. The electron beam apparatus according to any of the preceding clauses, wherein the first direction and the second direction are orthogonal.
5. The electron beam apparatus according to any of the preceding clauses, wherein the positioning device comprises a further balance mass, the further balance mass being configured to move in a second direction in response to a component of the reaction force in the second direction.
6. The electron beam apparatus according to any of the preceding clauses, wherein a center of gravity of the balance mass and a center of gravity of the object table are coplanar in the plane defined by the first direction and the second direction.
7. The electron beam apparatus according to any of the preceding clauses, wherein the positioning device comprises a passive mount of the balance mass, the passive mount providing for a passive damping of the movement of the balance mass in response to the reaction force.
8. The electron beam apparatus according to clause 7, wherein the passive mount provides a progressive passive damping.
9. The electron beam apparatus according to clause 8, wherein the passive mount comprises a progressive spring.
10. The electron beam apparatus according to any of the preceding clauses, wherein the positioning device comprises an active mount of the balance mass, the active mount providing for an active damping of the movement of the balance mass in response to the reaction force.
11. The electron beam apparatus according to clause 10, wherein the active mount provides a progressive active damping.
12. The electron beam apparatus according to clause 11, wherein the active mount comprises a gain scheduled controller.
13. The electron beam apparatus according to clause 10 to 12, further comprising a passive mount comprising a spring and/or a damper, wherein the active mount further configured to at least partially compensates for a force caused by the spring and/or the damper in response to a motion of the balance mass.

14. The electron beam apparatus according to clauses 10 to 13, the active mount further comprising an electromagnetic actuator, wherein a motor constant of the electromagnetic actuator is calibrated and/or a control error of the electromagnetic actuator at least partially due to the motor constant is compensated at least partly based on an object table set-point, a measurement of a position of the object table, a balance mass set-point, and/or a measurement of the balance mass.

15. An electron beam apparatus, the apparatus comprising:
an electron optics system configured to generate an electron beam;
an object table configured to hold a specimen at a target position so that a target portion of the specimen is irradiated by the electron beam;
a positioning device configured to displace the object table relative to the electron beam, the positioning device comprises a stage plate and a stage actuator, the stage plate being configured to support the stage actuator and the stage actuator being configured to exert a force between the object table and the stage plate to cause an acceleration of the object table, the force onto the object table resulting in a reaction force onto the stage plate; and
a motion compensation system configured to act between the stage plate and a stationary structure, the motion compensation system being configured to at least partly counteract the reaction force exerted on the stage plate.

16. The electron beam apparatus according to clause 15, further comprising a vacuum vessel configured to confine a vacuum of the electron beam apparatus, the object table and the positioning device arranged in the vacuum vessel.

17. The electron beam apparatus according to clause 16, wherein the stationary structure is arranged outside the vacuum vessel.

18. The electron beam apparatus according to clause 16 or 17, further comprising a vibration damper supporting the stage plate on a wall of the vacuum vessel, the vibration damper having a low frequency roll-off, wherein the motion compensation controller is configured to drive the actuator in a frequency band below the low frequency roll-off.

19. The electron beam apparatus according to clause 15 to 18, wherein the motion compensation system comprises a mounting device which connects the stage plate to the stationary structure.

20. The electron beam apparatus according to clause 19, the vacuum vessel comprising a diaphragm or bellows, wherein the mounting device connects the stage plate to the stationary structure via the diaphragm or bellows.

21. The electron beam apparatus according to clause 19 or 20, the stationary structure comprising a support of the vacuum vessel, wherein the mounting device supports the stage plate on the support of the vacuum vessel.

22. The electron beam apparatus according to any of clause 15 to 21, wherein the motion compensation system comprises:
a motion compensation actuator configured to generate a force between the stage plate and the stationary structure, and
a motion compensation controller, the motion compensation controller having a motion compensation controller input to which an object table position signal of the object table is provided, and a motion compensation controller output connected to the motion compensation actuator to drive the motion compensation actuator, the motion compensation controller configured to derive an acceleration profile from the object table position signal and to provide a feed-forward signal to the motion compensation actuator on the basis of the acceleration profile.

23. The electron beam apparatus according to any of clause 15 to 22, wherein the motion compensation controller is configured to generate the feed-forward signal as a mass feed-forward in a center of gravity of moving parts of the object table and the actuator.

24. An electron beam apparatus, the apparatus comprising:
an electron optics system configured to generate electron beam;
an object table configured to hold the specimen at a target position so that a target portion of the specimen is irradiated by the electron beam; and
a positioning device configured to displace the object table relative to the electron beam, the positioning device comprising:
a first actuator configured to move the object table along at least one direction over a first range of movement;
a second actuator configured to move the object table and the first actuator along the at least one direction over a second range of movement; and
a reaction mass,
wherein the first actuator is configured to exert a first actuator force between the object table and the reaction mass, the first actuator force onto the object table resulting in a first actuator reaction force onto the reaction mass, the reaction mass being configured to move in response to the reaction force.

25. The electron beam apparatus according to clause 24, further comprising a vacuum vessel configured to confine a vacuum of the electron beam apparatus, the object table and the positioning device arranged in the vacuum vessel.

26. The electron beam apparatus according to clause 24 or 25, the first actuator comprising a movable part and a counterpart, the first actuator being configured to generate a first actuator force between the movable part and the counterpart, the movable part being attached to the object table, wherein the reaction mass is comprised in the counterpart and is movable along the at least one direction.

27. The electron beam apparatus according to any of clause 24 to 26, wherein the first actuator comprises a damper to damp a reaction movement of the reaction mass in response to the reaction force.

28. The electron beam apparatus according to any of clause 24 to 27, wherein the first actuator is a short stroke actuator, the second actuator is a long stroke actuator, and the second range of movement is larger than the first range of movement.

29. The electron beam apparatus according to clause 28, further comprising a stage controller connected to the positioning device to drive the positioning device, the stage controller configured to drive the second actuator to perform a movement at a substantially constant velocity over at least part of the second range of movement, and to drive the first actuator to alternately compensate for the movement at the substantially constant velocity and accelerate the object table to a following position.

30. An electron beam apparatus, the apparatus comprising:
an electron optics system configured to generate an electron beam;
an object table configured to hold the specimen at a target position so that a target portion of the specimen is radiated with the electron beam;
a positioning device configured to displace the object table relative to electron optics system; and
a vacuum vessel configured to confine a vacuum, the object table and the positioning device arranged in the vacuum vessel,
wherein a base frame arranged to support the vacuum vessel and the positioning device.

31. The electron beam apparatus according to any of the preceding clauses containing the vacuum vessel, wherein a base frame is arranged to support the vacuum vessel and the positioning device.

32. The electron beam apparatus according to clause 31, further comprising a support element, wherein the base frame supports the positioning device via the support element, and the support element extends through a wall of the vacuum vessel.

33. The electron beam apparatus according to clause 32, wherein the positioning device comprises a stage plate, the positioning device is configured to exert a force between the object table and the stage plate to cause an acceleration of the object table, and the support element supports the stage plate.

34. The electron beam apparatus according to any of clause 30 to 33, further comprising a vibration isolation system, wherein the base frame supports the vacuum vessel via the vibration isolation system.

35. The electron beam apparatus according to any of the preceding clauses, wherein the electron beam apparatus is an electron beam inspection apparatus, an SEM, an e-beam writer, an e-beam metrology apparatus, an e-beam lithography apparatus, and an E-beam defect verification apparatus.

Although the above clauses refer to electron beam apparatus, the embodiments in these clauses can immediately be implemented into any vacuum apparatus, such as EUV radiation apparatus, for example, used in lithography, metrology, or inspection. Furthermore, the electron beam apparatus in the above embodiments may be a single beam electron beam apparatus or multiple beam electron beam apparatus.

The above describes the electron beam inspection apparatus according to various embodiments separately. A combination of the various embodiments may however be combined into the same electron beam inspection apparatus. For example, the electron beam inspection apparatus having the balance mass embodiment may be provided with a motion compensation system as described herein. The balance mass may accommodate a part of the reaction forces. The frame motion compensation (active or passive) may at least partly counteract an effect of a remainder of the reaction forces. Hence, the combination of a balance mass plus frame motion compensation may provide for a stable system whereby an injection of reaction forces into, for example, a frame or a vacuum vessel of the electron beam inspection apparatus may be reduced to a large extent. As another example, the electron beam inspection apparatus having the balance mass may be provided with the first and second actuators and reaction mass as described herein. As another example, the electron beam inspection apparatus provided with a motion compensation system as described herein may be provided with the first and second actuators and reaction mass as described herein. As a still further example, an electron beam inspection apparatus may employ the balance mass, the motion compensation system and the first and second actuators and reaction mass as described herein. It will be understood that further embodiments, modifications, optional features, etc. of the electron beam inspection tool as described herein may be applied when combining the balance mass, the motion compensation system and/or the first and second actuators and reaction mass as described herein in an electron beam inspection apparatus.

It is to be understood that other modifications and variation can be made without departing the spirit and scope of the present disclosure as hereafter claimed.

What is claimed is:

1. An electron beam apparatus, the apparatus comprising:
an electron optics system configured to generate an electron beam;
an object table configured to hold a specimen at a target position so that a target portion of the specimen is irradiated by the electron beam; and
a positioning device configured to displace the object table relative to the electron beam, the positioning device comprising a stage actuator and a balance mass, the stage actuator configured to exert a force onto the object table to cause an acceleration of the object table, the force onto the object table resulting in a reaction force onto the balance mass, the balance mass is configured to move in response to the reaction force;
wherein the positioning device is configured to enable the balance mass to move in a first direction in response to a component of the reaction force in the first direction, and
wherein a center of gravity of the balance mass and a center of gravity of the object table are coplanar in a plane defined by the first direction and a second direction, wherein the first direction and the second direction define a main plane of the specimen.

2. The electron beam apparatus according to claim 1, further comprising a vacuum vessel configured to confine a vacuum of the electron beam apparatus, the object table and the positioning device arranged in the vacuum vessel.

3. The electron beam apparatus according to claim 1, wherein the first direction and a second direction define a main plane of the specimen, a third direction is orthogonal to the first and second directions, and the positioning device is configured to enable the balance mass to move in the first and second directions and to rotate about the third direction.

4. The electron beam apparatus according to claim 1, wherein the positioning device comprises a further balance mass, the further balance mass being configured to move in a second direction in response to a component of the reaction force in the second direction.

5. The electron beam apparatus according to claim 1, wherein the positioning device comprises a passive mount of the balance mass, the passive mount providing for a passive damping of a movement of the balance mass in response to the reaction force.

6. The electron beam apparatus according to claim 5, wherein the passive mount provides a progressive passive damping.

7. The electron beam apparatus according to claim 6, wherein the passive mount comprises a progressive spring.

8. The electron beam apparatus according to claim 1, wherein the positioning device comprises an active mount of the balance mass, the active mount providing for an active damping of the movement of the balance mass in response to the reaction force.

9. The electron beam apparatus according to claim 8, wherein the active mount provides a progressive active damping.

10. The electron beam apparatus according to claim 9, wherein the active mount comprises a gain scheduled controller.

11. The electron beam apparatus according to claim 8, further comprising a passive mount comprising a spring and/or a damper, wherein the active mount is further configured to at least partially compensate for a further force caused by the spring and/or the damper in response to the movement of the balance mass.

12. The electron beam apparatus according to claim 8, the active mount further comprising an electromagnetic actuator, wherein a motor constant of the electromagnetic actuator is calibrated and/or a control error of the electromagnetic actuator at least partially due to the motor constant is compensated at least partly based on an object table set-point, a measurement of a position of the object table, a balance mass set-point, and/or a measurement of a position of the balance mass.

13. The electron beam apparatus according to claim 1, further comprising:
a vacuum vessel configured to confine a vacuum of the electron beam apparatus, the object table and the positioning device being arranged in the vacuum vessel;
a base frame arranged to support the vacuum vessel; and
a support element;
wherein the base frame supports the positioning device via the support element, the support element extending through a wall of the vacuum vessel.

14. The electron beam apparatus according to claim 13, further comprising a vibration isolation system, wherein the base frame supports the vacuum vessel via the vibration isolation system.

15. The electron beam apparatus according to claim 1, further comprising a motion compensation system being connected to a stationary structure and being coupled between the stationary structure and the object table to at least partially compensate an even further force caused by an acceleration of the object table, wherein the motion compensation system comprises a motion compensation controller and a motion compensation actuator.

16. The electron beam apparatus according to claim 15, further comprising a vacuum vessel configured to confine a vacuum of the electron beam apparatus, the object table and the positioning device arranged in the vacuum vessel, wherein the stationary structure is arranged outside the vacuum vessel.

17. The electron beam apparatus according to claim 16, further comprising a vibration isolation system supporting a stage plate on a wall of the vacuum vessel, the vibration isolation system having a low frequency roll-off, wherein the motion compensation controller is configured to drive the motion compensation actuator in a frequency band below the low frequency roll-off.

18. The electron beam apparatus according to claim 15, wherein the motion compensation controller is configured to generate a feed-forward signal as a mass feed-forward in a center of gravity of moving parts of the object table and the stage actuator.

19. The electron beam apparatus according to claim 1, wherein the electron beam apparatus is an electron beam inspection apparatus, a scanning electron microscope, an e-beam writer, an e-beam metrology apparatus, an e-beam lithography apparatus, or an e-beam defect verification apparatus.

* * * * *